United States Patent [19]

Ohsawa

[11] Patent Number: 5,296,412
[45] Date of Patent: Mar. 22, 1994

[54] METHOD OF HEAT TREATING SEMICONDUCTOR WAFERS BY VARYING THE PRESSURE AND TEMPERATURE

[75] Inventor: Tetu Ohsawa, Sagamihara, Japan

[73] Assignees: Tokyo Electron Limited, Tokyo; Tokyo Electron Tohoku Limited, Esashi, both of Japan

[21] Appl. No.: 82,458

[22] Filed: Jun. 25, 1993

[30] Foreign Application Priority Data

Jun. 26, 1992 [JP] Japan .................. 4-168870

[51] Int. Cl.$^5$ .......................................... H01L 21/324
[52] U.S. Cl. .................. 437/247; 437/949; 148/DIG. 38
[58] Field of Search ............... 437/141, 225, 233, 238, 437/247, 248, 949; 148/DIG. 21, DIG. 22, DIG. 30, DIG. 36, DIG. 37, DIG. 38

[56] References Cited

U.S. PATENT DOCUMENTS

| | | | |
|---|---|---|---|
| 4,190,470 | 2/1980 | Walline | 437/949 |
| 4,438,157 | 3/1984 | Romano-Moran | 437/238 |
| 4,698,104 | 10/1987 | Barker et al. | 437/247 |
| 5,116,784 | 5/1992 | Ushikawa | 437/225 |
| 5,137,847 | 8/1992 | Shimakura et al. | 437/248 |

OTHER PUBLICATIONS

Jintate et al., U.S. application Ser. No. 07/873,170, Apr. 1992.

*Primary Examiner*—Brian E. Hearn
*Assistant Examiner*—Chandra Chaudhari
*Attorney, Agent, or Firm*—Oblon, Spivak, McClelland, Maier & Neustadt

[57] ABSTRACT

A wafer boat on which semiconductor wafers are placed is inserted into a process tube, and a process gas is supplied into the process tube to perform heat treating. In this case, prior to the heat treating, the process tube is evacuated to have a pressure lower than a pressure in the heat treating while a temperature in the process tube is kept to be higher than a temperature in the heat treating. After the heat treating is performed, the process tube is purged with an $N_2$ gas.

15 Claims, 3 Drawing Sheets

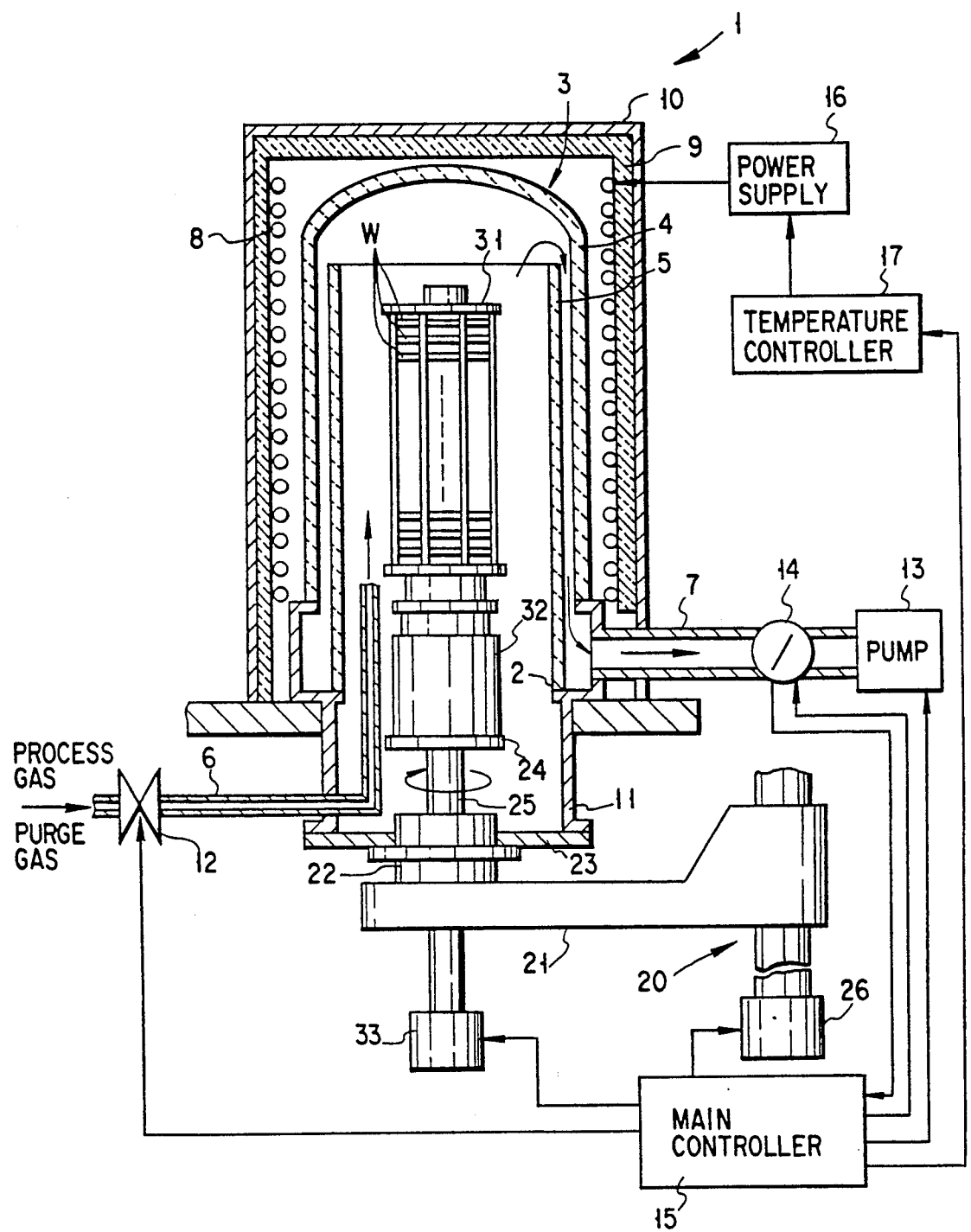
F I G. 1

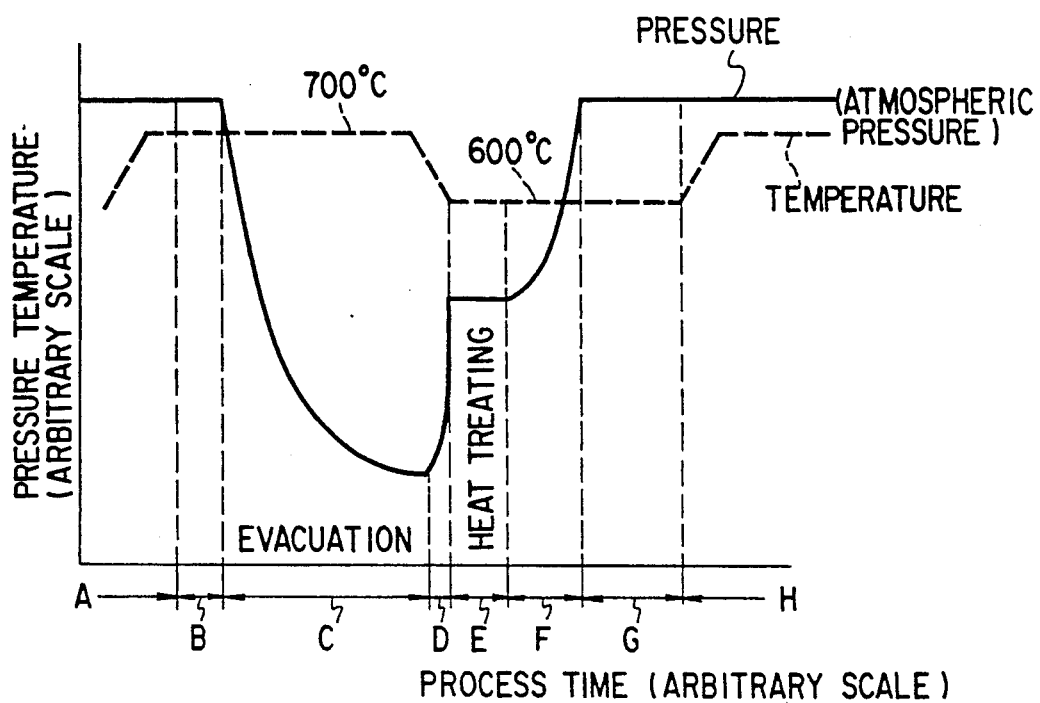
F I G. 2
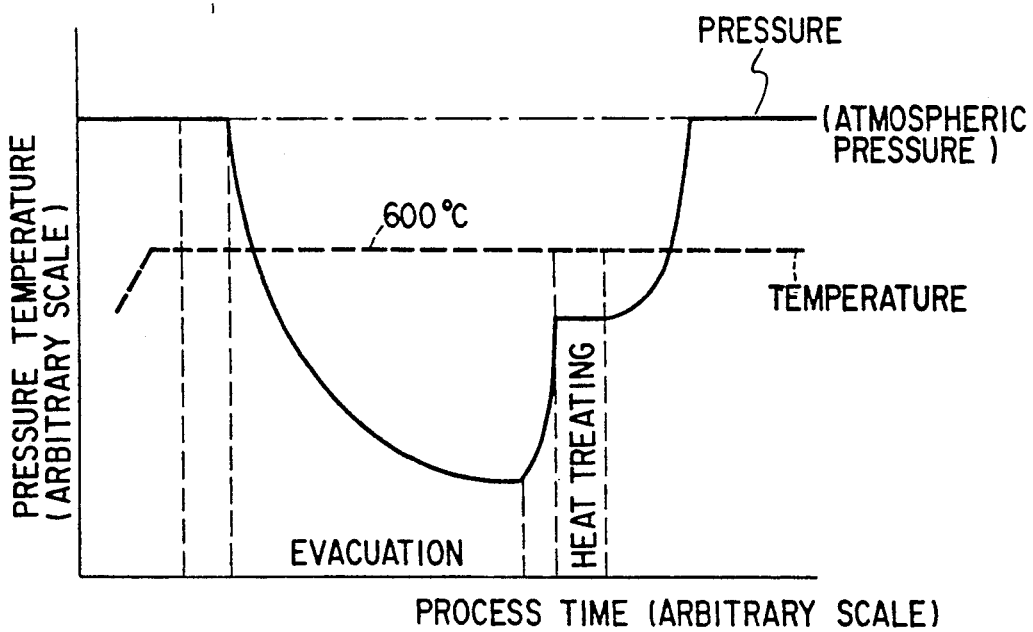
F I G. 3

METHOD OF HEAT TREATING SEMICONDUCTOR WAFERS BY VARYING THE PRESSURE AND TEMPERATURE

BACKGROUND OF THE INVENTION

1. Field of the Invention

The present invention relates to a method of heat treating an object to be processed such as a semiconductor wafer.

2. Description of the Related Art

In the conventional steps in manufacturing a semiconductor device, a heat-treating apparatus comprising a cylindrical process tube is used. The heat-treating apparatus performs predetermined heat treating to a semiconductor wafer serving as an object to be processed at a predetermined pressure and a predetermined temperature in the process tube. In recent years, as a heat-treating apparatus, a vertical type apparatus in which a process tube is vertically arranged has been popularly used in place of a conventional horizontal type apparatus in which a process tube is horizontally arranged.

In the vertical heat-treating apparatus, the process tube is formed of quarts or fused silica, the lower end of the process tube is open, and a semiconductor wafer serving as an object to be processed is loaded/unloaded in/from the lower opening. In this case, a plurality of wafers are placed on a wafer boat such that the surfaces of the wafers are kept horizontal, the wafers in this state are loaded/unloaded in/from the process tube. A heater and a heat insulator are arranged around the process tube to heat interior of the process tube, and a discharge pipe and a process gas supply pipe are connected to the lower portion of the process tube.

In the heat-treating apparatus, the wafer boat with the wafers is loaded in the process tube, the process tube is evacuated from the discharge pipe, and a predetermined process gas is supplied from the process gas supply pipe. In this state, a predetermined process, e.g., a CVD process, is performed to the semiconductor wafers at a predetermined process temperature and a predetermined process pressure.

In recent years, semiconductor devices tend to be highly integrated, and circuit patterns of the semiconductor devices tend to be further micropatterned accordingly. For this reason, in each processing step in the manufacture of a semiconductor device, the accuracy of each processing step must be improved. In heat treating, a heat-treated layer rarely containing an impurity must be obtained by improving the processing accuracy. For this purpose, improvement of the purity of a process gas and an increase in degree of vacuum in heat treating are considered.

However, even when the purity of the process gas is improved, and the heat treating is performed at a predetermined degree of vacuum, a gas is produced from semiconductor wafers and the inner wall of a process tube during the heat treating. For this reason, a small amount of impurity mixes in the atmosphere, thereby degrading the purity of a heat-treated layer.

In addition, improvement of processing accuracy easily causes a considerable decrease in throughput, and high-purity annealed layers must be formed while the decrease in throughput is suppressed.

SUMMARY OF THE INVENTION

It is an object of the present invention to provide a heat-treating method capable of forming a high purity heat-treated layer without a decrease in throughput.

According to the present invention, first, there is provided a heat-treating method comprising a step of inserting an object to be processed into a process tube, a heat-treating step of supplying a process gas into the process tube to perform heat treating, and a step of evacuating the process tube such that a pressure in the process tube is set to be lower than a pressure in the heat-treating step while a temperature in the process tube is kept to be higher than a temperature in the heat-treating step prior to the heat-treating step.

Second, there is provided a heat-treating method comprising a step of inserting an object to be processed into a process tube, a heat-treating step of supplying a process gas into the process tube to perform heat treating, a first evacuating step of evacuating the process tube such that a pressure in the process tube is set to be lower than a pressure in the heat-treating step while a temperature in the process tube is kept to be higher than a temperature in the heat-treating step prior to the heat-treating step, a second evacuating step of evacuating the process tube after the heat-treating step, and a step of purging the process tube with a gas.

In this invention, prior to heat treating, the process tube is evacuated to have a pressure lower than a pressure in the heat treating, thereby discharging a gas from an object to be processed and the inner wall of the process tube in advance. For this reason, the gas produced from the inner surface of the process tube and the like is suppressed during the heat treating. As a result, a high purity heat-treated layer can be formed. In this case, the generation of a gas from the object and the inner wall of the process tube is enhanced because a temperature in the process tube is set to be higher than the heat-treating temperature, thereby shortening the time required for causing the pressure in the process tube to reach a predetermined degree of vacuum. As a result, the throughput is increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing a heat-treating apparatus to which the present invention is applied;

FIG. 2 is a graph showing a relationship between a temperature and a pressure in a process tube in each step when a heat-treating method according to an embodiment the present invention is employed;

FIG. 3 is a graph showing a relationship between a temperature, a pressure, and a time in a process tube in each step when the temperature is kept constant.

DETAILED DESCRIPTION OF THE PREFERRED EMBODIMENTS

Figure 4:
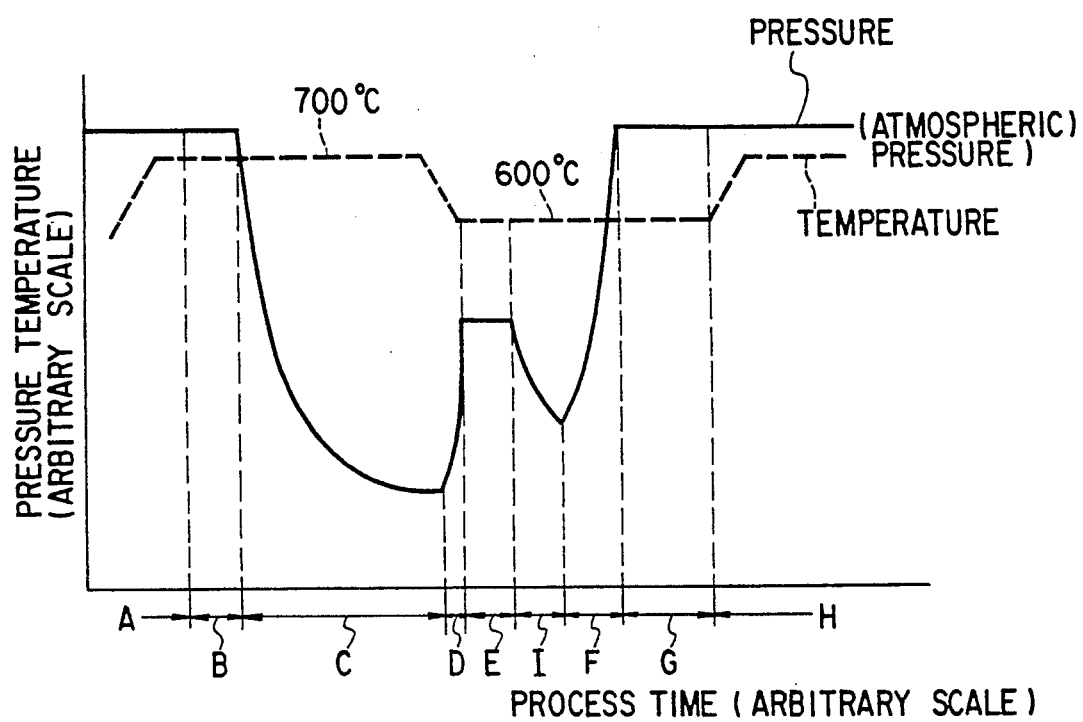
FIG. 4 is a graph showing a relationships between a temperature, a pressure, and a time in a process tube in each step when a heat-treating method according to another embodiment of the present invention is employed.

According to the present invention, as described above, prior to the step of heat treating, a temperature in a process tube is kept to be higher than the temperature in the above heat treating, and the process tube is evacuated at a pressure lower than a pressure in the step of heat treating. In this manner, a heat-treated layer having high purity can be formed at a very high throughput. The temperature in the process tube is not conventionally increased to be higher than the heat-treating temperature because impurities are unnecessarily diffused. However, in contrast to this conventional fixed idea, the temperature in the process tube is kept to be higher than the heat-treating temperature prior to the heat-treating so as to positively discharge a gas, thereby forming high-purity films at high efficiency.

The present invention will be described below.

The present invention is applied when an object to be processed is heat treated by a process gas to form a predetermined heat-treated layer. As this heat treating, a process in a low-pressure atmosphere is preferably performed. A CVD process, an oxidation process, or a diffusion process is known as the heat-treating process. A semiconductor wafer or an LCD substrate is used as the object to be processed. More specifically, the present invention can be applied to formation of an SN film on a semiconductor wafer, formation of a capacitor, formation of an oxide film such as a gate oxide film, or formation of a poly-Si film. The present invention is effectively applied to a case wherein a high-quality film having a thickness of 100 Å or less must be formed.

A high-temperature and high-degree-of-vacuum process performed prior to heat treating is performed at a pressure of 1/10 heat-treating pressure or less, preferably at a pressure of 1/100 heat-treating pressure or less, for example, about $10^{-3}$ to $10^{-7}$ Torr, and the temperature higher than the heat-treating temperature by 50° to 300° C., preferably by 100 to 200° C. However, the temperature must be properly set depending on types of processes because the upper limits of the temperature are set depending on the types of processes. Although a lower pressure is preferably set to remove an impurity, to reduce a pressure to 1/10 is generally to prolong the evacuation time ten times. The pressure must be properly set in consideration of a required throughput and an allowable impurity amount.

When heat treating is to be performed at 0.1 Torr and 600° C., a process tube is evacuated to have a pressure of e.g., $10^{-6}$ Torr at 700° C. as a high-temperature and high-degree-of-vacuum process performed prior to the heat treating. This process causes an object to be processed, the inner wall of the process tube, and the like to quickly discharge a gas. For this reason, generation of an impurity gas from the object, the inner wall of the process tube, and the like is suppressed during heat treating, thereby forming an high-purity heat-treated layer.

An example in which the present invention is applied to a CVD process for a semiconductor wafer will be described below. FIG. 1 is a sectional view showing a heat-treating apparatus to which the present invention is applied. The heat-treating apparatus 1 forms a CVD film on a semiconductor wafer and has a cylindrical process tube 3 consisting of quarts, fused silica, or the like. The process tube 3 is vertically arranged and has an opening 2 at its lower end. The process tube 3 has a double-tube structure constituted by an outer cylinder 4 and an inner cylinder 5, and a gas supply pipe 6 reaching the inside of the inner cylinder 5 and a discharge pipe 7 connected between the inner cylinder 5 and the outer cylinder 4 are arranged at the lower portion of the process tube 3. A heater 8 is arranged around the process tube 3 to surround the process tube 3, and a heat insulator 9 is arranged around the heater 8. These members are arranged in an outer shell 10 formed of stainless steel. The process tube 3 is supported by a cylindrical manifold 11 arranged thereunder.

A plurality of semiconductor wafers W to be processed are placed on a wafer boat 31 such that the surfaces of the semiconductor wafers W are kept horizontal. The wafer boat 31 on which the wafers are placed is placed on a support table 21 of a boat elevator 20 through a lid 23 and a heat-insulating cylinder 32. The wafer boat 31 is loaded in the process tube 3 by a motor 26 of the boat elevator 20, or is unloaded from the process tube 3. In a state of loading the wafer boat 31, the lower opening of the manifold 11 is sealed by the lid 23 to airtightly seal the process tube 3. The heat-insulating cylinder 32 is placed on a turntable 24, a rotating shaft 25 extending in the lower direction is connected to the turntable 24, and the rotating shaft 25 extends through the lid 23 and the support table 21 and is connected to a motor 33. The heat-insulating cylinder 32 can be rotated by the motor 33, and the heat-insulating cylinder 32 and the wafer boat 31 thereon are rotated during heat treating to allow uniform heat treating.

The gas supply pipe 6 is connected to a process gas supply mechanism (not shown), and a process gas used for a predetermined CVD process is supplied into the inner cylinder 5 through the gas supply pipe 6. The pipe 6 is connected to a purge gas supply mechanism (not shown), too, and a purge gas is supplied into the process tube 3. Note that a valve 12 for adjusting a flow rate is arranged in the gas supply pipe 6.

The discharge pipe 7 is connected to a vacuum pump 13, and an auto-pressure controller 14 for automatically controlling a pressure in the process tube 3 is arranged midway along the discharge pipe 7. The auto-pressure controller 14 is constituted by a detector and a control unit, and a control signal is output from a main controller 15 to the control unit on the basis of a detection signal output from the detector to the main controller 15. In this manner, the pressure in the process tube 3 is automatically controlled to a pressure which is programmed in the main controller 15 in advance.

The valve 12 arranged in the gas supply pipe 6 is also controlled by the main controller 15. A power supply 16 for the heater 8 is connected to a temperature controller 17, and the temperature controller 17 controls an output from the heater 8 on the basis of the control signal from the main controller 15, thereby controlling the temperature in the process tube 3. The motors 26, 33 are also controlled by the main controller 15.

A state in which heat treating of the present invention is performed by the heat-treating apparatus with the above arrangement will be described below with reference to FIG. 2.

In a state of closing the valve 12, the heater 8 is rendered conductive in accordance with information set in the main controller 15, and the temperature in the process tube 3 is set to be higher than a process temperature. For example, when the heat-treating temperature is 600° C., the inside of the process tube 3 is heated to 700° C. (A in FIG. 2).

The wafer boat 31 with semiconductor wafers W is loaded in the process tube 3 by the boat elevator 20. At this time, when the support table 21 is lifted to the uppermost portion, the lid 23 is brought into tight contact with the lower end of the manifold 11, and the air-tight state of the process tube 3 is maintained (B in FIG. 2).

In this state, the process tube 3 is evacuated by a vacuum pump 13, and the pressure in the process tube 3 is set to be a predetermined pressure lower than a heat-treating pressure. For example, when the heat-treating pressure is 0.1 Torr, the predetermined pressure is set to be $10^{-6}$ Torr (C in FIG. 2).

After the pressure reaches this low pressure, the output of the power supply 16 is decreased, and the valve 12 is opened to supply a process gas into the process tube 3 (D in FIG. 2).

The pressure and temperature are controlled under the heat-treating conditions (e.g., 600° C., 1 Torr) set in advance, a predetermined CVD process is performed while the turntable 24 is rotated, thereby forming a predetermined CVD film on each of the semiconductor wafers W (E in FIG. 2).

After the CVD process is completed, a purge gas, e.g., an $N_2$ gas, is supplied into the process tube 3 in place of the process gas, the process gas in the process tube 3 is replaced with the purge gas, and the pressure in the process tube 3 is increased to the atmospheric pressure (F in FIG. 2).

The support table 21 is moved downward by the boat elevator 20 to remove the wafer boat 31 from the process tube 3 (G in FIG. 2).

In preparation to the next process, the temperature in the process tube 3 is increased to a temperature (e.g., 700° C.) higher than the process temperature (H in FIG. 2).

In employing the above heat-treating method, when the process tube 3 is set in a high-temperature and high-degree-of-vacuum state prior to heat treating, a gas is quickly discharged from the wafers W and the inner wall of the process tube 3 and is completely discharged from the wafers W and the inner wall of the process tube 3 within a short time. Therefore, heat treating for forming a CVD film can be performed in a state wherein an impurity gas component discharged from the semiconductor wafers W and the inner wall of the process tube 3 is rarely present in a heat-treating atmosphere, and high-purity films rarely containing an impurity can be formed at high efficiency (high throughput).

In contrast to this, when only the pressure in the process tube 3 is decreased to a degree of vacuum higher than that of heat treating prior to heat treating, and the temperature in the process tube 3 is set to be equal to a process temperature (e.g., 600° C.), as shown in FIG. 3, a long time is required for discharging a gas from the semiconductor wafers W and the inner wall of the process tube 3. For this reason, the time for evacuation until the degree of vacuum in the process tube 3 reaches a predetermined degree of vacuum is prolonged, thereby reducing the throughput.

For example, when the temperature in the process tube 3 was kept at the process temperature, i.e., 600° C., 6 hours were required for causing the pressure in the process tube to reach the degree of vacuum of $10^{-6}$ Torr. However, when the temperature in the process tube was kept at 700° C., the pressure in the process tube reached the degree of vacuum of $10^{-6}$ Torr in about 3 hours.

As has been described above, according to the present invention, a temperature in the process tube is set to be higher than the heat-treating temperature, and the process tube is evacuated such that a pressure in the process tube set to be lower than that set during heat treating. For this reason, an impurity gas can be discharged at very high efficiency prior to heat treating. Therefore, high-purity heat-treated layers can be formed at a high throughput.

In order to further increase the throughput, as shown in FIG. 4, after the heat treating is performed, it is preferable that the process tube is temporarily evacuated prior to supply of a purge gas into the process tube 3 (I in FIG. 4) because of the following reason. That is, when the process tube is temporarily evacuated, the efficiency of replacing the process gas with the purge gas is increased, and the process gas in the process tube is replaced with the purge gas in a short time.

As has been described above, the present invention can be applied to not only a CVD process but also other processes such as an oxidation process and a diffusion process. When the present invention is applied to the oxidation process, an oxide layer is formed; and when the present invention is applied to the diffusion process, a diffusion layer is formed. In addition, an LCD substrate can be employed as an object to be processed as described above. Although heat treating of a plurality of objects to be processed has been described above, the present invention can be applied to a single-object process (single-wafer process), as matter of course. Furthermore, the present invention can be applied to not only a vertical heat-treating apparatus but also a horizontal heat-treating apparatus.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A heat-treating method comprising:
    a step of inserting an object to be processed into a process tube;
    a heat-treating step of supplying a process gas into said process tube to perform heat treating; and
    a step of evacuating said process tube such that a pressure in said process tube is set to be lower than a pressure in the heat-treating step while a temperature in said process tube is kept to be higher than a temperature in the heat treating prior to the heat-treating step.

2. A method according to the claim 1, wherein the heat-treating step is performed in a low-pressure atmosphere.

3. A method according to the claim 2, wherein the heat treating is one process selected from the group consisting of a CVD process, an oxidation process, and a diffusion process.

4. A method according to the claim 1, wherein a temperature in said process tube is set to be higher than heat-treating temperature by 50° to 300° C. prior to the heat-treating step.

5. A method according to the claim 4, wherein said process tube is evacuated prior to the heat-treating step such that a pressure in said process tube is set to be equal to or less than 1/10 to a pressure of the heat-treating step.

6. A method according to the claim 5, wherein a temperature in said process tube is set to be 700° C. prior to the heat-treating step, the process tube is evacuated to have a pressure of $10^{-6}$ Torr, and then the temperature and pressure in said process tube are set at 600° C. and 0.1 Torr, respectively, to perform the heat-treating step 7. A method according to the claim 1, further comprising the step of purging said process tube with a gas after the heat-treating step.

8. A method according to the claim 1, wherein said object to be processed includes a semiconductor wafer.

9. A heat-treating method comprising:
a step of inserting an object to be processed into a process tube;
a heat-treating step of supplying a process gas into said process tube to perform heat treating;
a first evacuating step of evacuating said process tube such that a pressure in said process tube is set to be lower than a pressure in the heat-treating step while a temperature in said process tube is kept to be higher than a temperature in the heat treating prior to the heat-treating step;
a second evacuating step of evacuating said process tube after the heat-treating step; and
a step of purging said process tube with a gas.

10. A method according to the claim 9, wherein the heat-treating step is performed in a low-pressure atmosphere.

11. A method according to the claim 10, wherein the heat treating is one process selected from the group consisting of a CVD process, an oxidation process, and a diffusion process.

12. A method according to the claim 9, wherein a temperature in said process tube is set to be higher than heat-treating temperature by 50° to 300° C. prior to the heat-treating step.

13. A method according to the claim 12, wherein said process tube is evacuated prior to the heat-treating step such that a pressure in said process tube is set to be equal to or less than 1/10 to a pressure of the heat-treating step.

14. A method according to the claim 13, wherein a temperature in said process tube is set to be 700° C. prior to the heat-treating step, the process tube is evacuated to have a pressure of $10^{-6}$ Torr, and then the temperature and pressure in said process tube are set at 600° C. and 0.1 Torr, respectively, to perform the heat-treating step.

15. A method according to the claim 9, wherein said object to be processed includes a semiconductor wafer.

* * * * *